United States Patent [19]
Chan et al.

[11] Patent Number: 5,740,412
[45] Date of Patent: Apr. 14, 1998

[54] SET-SELECT MULTIPLEXER WITH AN ARRAY BUILT-IN SELF-TEST FEATURE

[75] Inventors: Yuen Hung Chan, Poughkeepsie; Pong-Fei Lu, Yorktown Heights; Antonio Raffaele Pelella, Highland Falls, all of N.Y.

[73] Assignee: International Business Machines Corporation, Armonk, N.Y.;

[21] Appl. No.: 642,985

[22] Filed: May 6, 1996

[51] Int. Cl.⁶ .................................................. G16F 1/04
[52] U.S. Cl. ...................................... 395/559; 395/496
[58] Field of Search ............................ 395/444, 445, 395/455, 467, 494, 496, 559

[56] References Cited

U.S. PATENT DOCUMENTS

| | | | |
|---|---|---|---|
| 5,557,768 | 9/1996 | Braceras et al. | 395/467 X |
| 5,561,782 | 10/1996 | O'Connor | 395/467 |
| 5,577,228 | 11/1996 | Banerjee et al. | 395/457 |
| 5,640,527 | 6/1997 | Pecone et al. | 395/496 X |
| 5,655,105 | 8/1997 | McLaury | 395/496 |

OTHER PUBLICATIONS

"A 2-ns Cycle, 3.8-ns Access 512-kb CMOSECL SRAM with a Full Pipe-lined Architecture", T.I. Chappell et al, IEEE J. Solid State Circuits, vol. 26, pp. 1577-1585, 1991.

*Primary Examiner*—Thomas M. Heckler
*Attorney, Agent, or Firm*—Louis P. Herzberg; Robert P. Tassinari, Jr.

[57] ABSTRACT

A pipelined set-associative cache data READ/WRITE access circuit advancing the processing performance speeds in microprocessor memories. It provides an apparatus and method to obtain quick access to multi-way cache memory associates for both READ and WRITE operations satisfying the required increased memory access performance speeds for modern microprocessor utilizations. Special methodology is employed to minimize the number of pathways and the pathway through-time of the longest time critical path even with a provision of array built in self test (ABIST) capability.

13 Claims, 10 Drawing Sheets

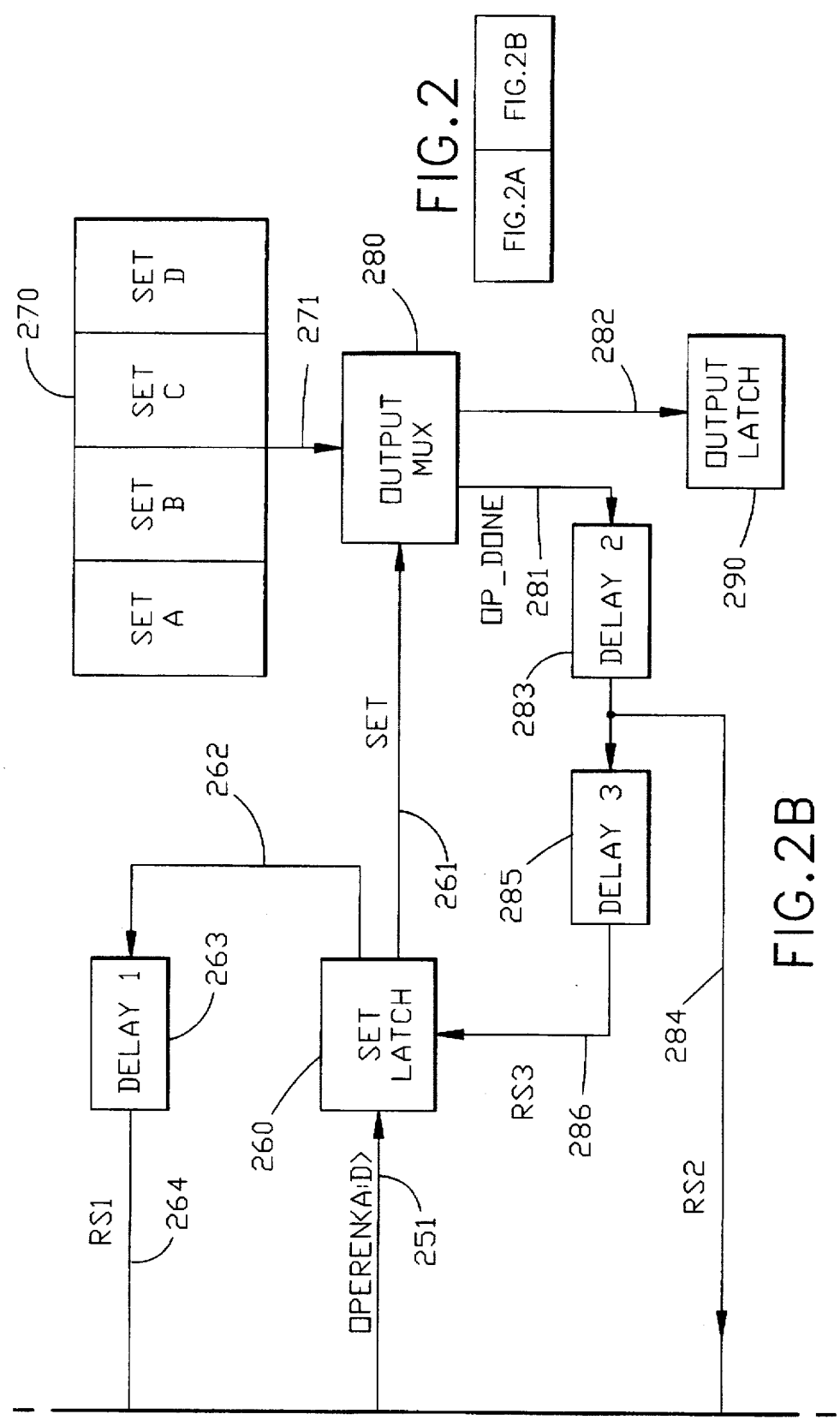

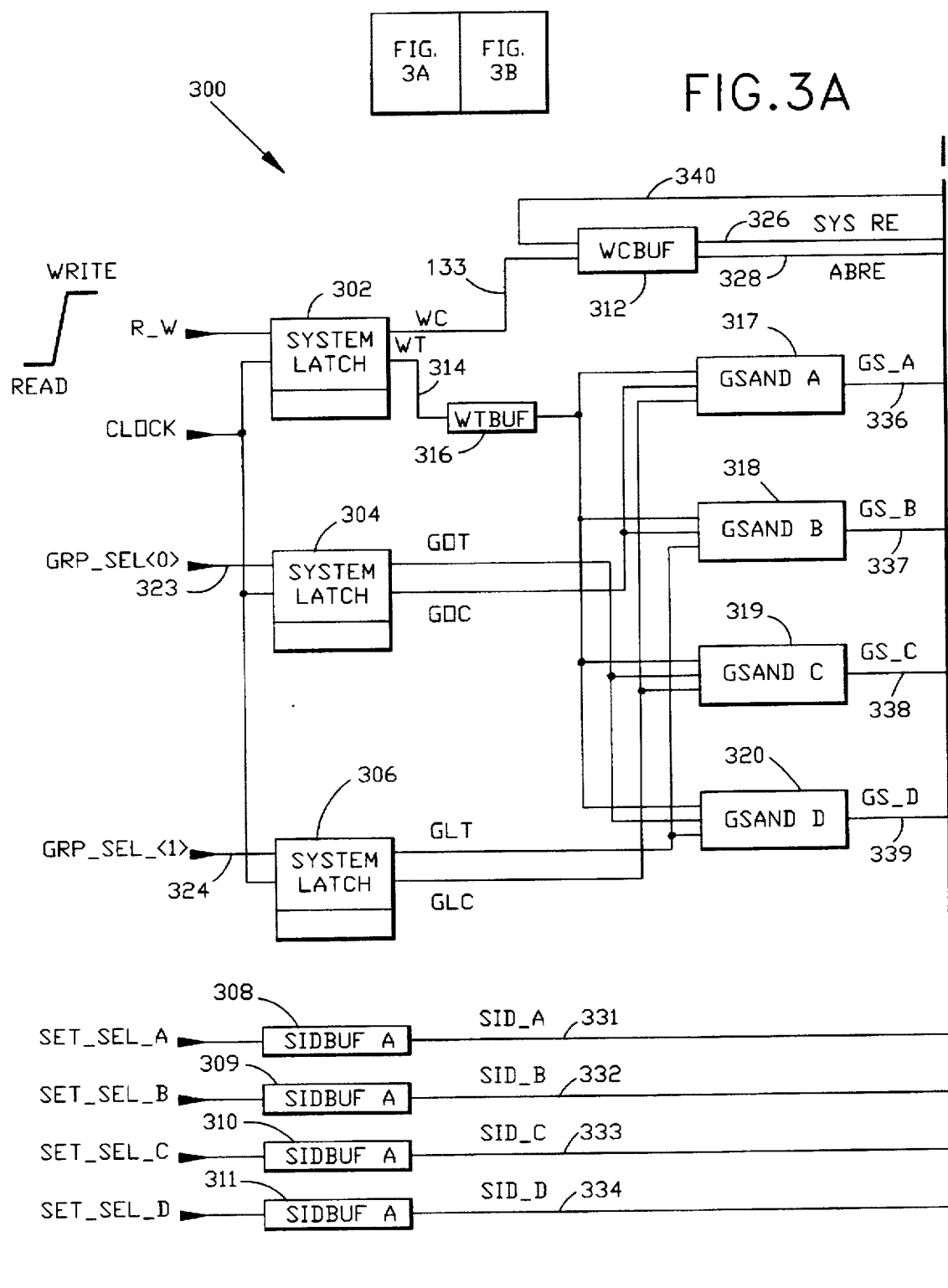

SET-SELECT MULTIPLEXER WITH AN ARRAY BUILT-IN SELF-TEST FEATURE

FIELD OF THE INVENTION

The present invention is directed to the field of integrated circuit memories. It is more particularly directed to pipelined set-associative cache data READ/WRITE access.

BACKGROUND OF THE INVENTION

It is a constant endeavor to find ways of removing limitations in advancing the processing performance speeds in microprocessor memories. This invention is concerned with a method to obtain quick access to multi-way cache memory associates for both READ and WRITE operations. In particular, a high speed reliable methodology is required for random READ/WRITE operations when using a pipelined architecture. Use of the fully pipelined architecture results in improvements in circuits, which can lower the access and cycle times of high-capacity SRAMs to less than 5 ns. This causes the READ/WRITE operation to become a critical limitation to increased speeds. Various methods heretofore employed fail to meet the access requirements of multi-way cache memory associates. Satisfaction of increased memory access performance speeds for modern microprocessor operations requires special care and methodology to minimize the number of pathways and the pathway through-time of the longest time critical path. The longest time critical path is a limitation in the performance speed of accessing cache memory. The problem is even more difficult to solve in a way that satisfies a provision of built in self test (BIST) capability. This is particularly so for chips designed for array built in self test, henceforth to be referred to as ABIST. ABIST design supports both low cost chip self test and in situ dynamic burn-in for stand alone or logic embedded arrays.

FIG. 1 shows a conventional real-address 4-way set-associative cache 100. The address buffer 102 contains the virtual page number 104 and the page offset 106. These are used to select a particular data-set A 122, B 123, C 124 or D 125 from memory. The set associate cache has three macros. These are the translation look-aside buffer (TLB) 108, the cache directory 110, and the cache array 112. Cache lookup is done by 'association' by comparing the 'real' page address 117 being accessed to the 'real' addresses 111 of the locations being held in the cache directory 110. Each line of memory has a portion of the main memory address, called a tag, stored along with it. The cache directory 110 comprises these tags. In hit logic circuit 114, the tag is compared to the main memory address using compare circuits 116, 118 to determine if there is a comparison. A valid comparison is referred to as a hit. The computer programming generally uses virtual addressing which requires that it be done before the compare can start. To speed up this process, recently translated addresses are stored in the TLB 108 for quick lookup.

A hit logic 114 'hit' activates a set-select signal 136 which feeds 'SSMUX' 140, forming set_<A:D> 142, to enable the pass-through from cache array 112 of only one of the four data-sets 122–125, through output mux 120 on the output line 130. During a normal READ access, the page-offset bits 134 are used to select the possible cache lines that could be correct. This is the congruence class, which consists of lines from cache array 112 for each of sets A, B, C, and D. Simultaneously, the virtual page number is translated via the TLB 108 and the cache directory 110, to see which set, if any, is the correct one to be passed through. Although the cache access and address lookup signals overlap in time, the address lookup usually has a longer delay time. This results in the late arrival of the set-select signals 136 which select the correct output mux 120 enabling signal for 122, 123, 124 or 125 for one of these data-sets.

Since today's microprocessor designs require single-cycle cache access, the address lookup function of FIG. 1 is usually one of the critical READ paths. In WRITE access, this 'late-select' scheme is not directly applicable since enablement cannot begin until the tag is checked to see if it is a hit. Because the tag checking cannot occur in parallel, WRITEs are here-to-fore normally done in multiple cycles, with a 'pretest' cycle for setting up the WRITE conditions. The set information gathered in the pretest cycle are stored in registers. When the cache WRITE cycle begins, there is no need for address lookup to decide which set to WRITE. Thus, in contrast to the late arrival of set-select signals 136 in READ access during WRITE access the set-select signals are available at the beginning of the cycle.

Depending on the design WRITE policy employed, there are two different cache designs. One is 'WRITE through cache' and the other is 'WRITE back cache'. In 'WRITE through cache' the information is written to both the block in the cache and to the block in the lower-level memory. In 'WRITE back cache' the information is written only to the block in the cache. The modified block is written to main memory only when it is replaced. The current invention is generally concerned with 'WRITE through cache'. The data appearing at the output of the cache array must be the same as the data being written into the cache.

Generally, the cache array 112, the cache directory 110, and the TLB 108 of FIG. 1 are implemented as individual static RAM (SRAM) macros. The hit logic 114 consists of customized circuit blocks outside of these macros. The set-select multiplexer, referred to as the 'SSMUX', 140, resides in proximity to the cache array 112, and gates the array output latches. In the READ mode the outputs of the 'SSMUX' 140 enable the output mux. A successful comparison in both compares, 116 and 118, results in the development of a READ set-select signal 136 which is used to enable the pass-through of only one data-set from 122–125 to produce output 130.

In the WRITE mode, the output mux 120 is enabled by WRITE-group select 150 generation of a valid 'write_' 152 signal feeding 'SSMUX' 140. Since the set-select signal 136 arrives late in the READ mode while the group-select signals 152 arrive early in the WRITE mode, the circuit needs to be able to realign these signals with respect to the system READ/WRITE enable signals. This is particularly important for dynamic CMOS designs, since the nodes that are preset cannot recover once they are wrongly set. Self-resetting CMOS (SRCMOS) circuit techniques have been developed for high performance SRAMs and logic macros. In SRCMOS circuits all signals propagate in the form of pulses with typical pulse widths of only a few hundred pico-seconds. When such narrow pulses are used to transmit data as required for cache type applications, pulse alignment becomes a critical issue. This is a special concern when the pulses are derived from logic signals with widely varying timing. This is a primary problem solved by the present invention.

Another requirement for these cache SRAM macros is that they must be self-testable as a stand-alone macro to satisfy chip-level testing methodology. This is generally not a serious problem in conventional scannable latch design for a WRITE operation since the set-select addresses are latched in registers which have an ABIST port. However, for a READ operation the ABIST READ capability is not readily available, since there is no system latch between the hit logic and the cache array.

A conventional approach is to insert a two-way multiplexer in the receiver which interfaces with the hit logic to separate system from ABIST operation. The present invention provides a 'SSMUX' circuit solution suitable for cache SRAM's implemented with pulsed circuit techniques. Besides pulse alignment the 'SSMUX' circuit also provides ABIST capability without impacting the critical path delay.

SUMMARY OF THE INVENTION

An aspect of the present invention is to provide a multiplexer selector circuit for set-associative cache application which supports pipelined READ/WRITE operations and array-built-in-self-test (ABIST). The circuit technique solves the disparity in the arrival time of set-selection pulse signals in a 'READ' and 'WRITE' operation, and provides capability to independently test the array macro.

A particular aspect is the provision of a signal selector circuit comprising: a clock signal defining a clock timing cycle; a plurality of data-sets; a multiplexer receiving the data-sets for outputting a selected data-set in response to the activation of a select-data-set signal corresponding with the selected data-set; at least one first operation circuit responsive to a first enabling signal and to a plurality of first control signals, wherein each of the control signals corresponds to one of the data-sets, and wherein the enabling signal, control signal and data-sets commence at a different time within the clock timing cycle. The first operation circuit includes a transfer circuit. In one embodiment the transfer circuit is formed from a plurality of AND gates. Each of the AND gates ANDs the first enabling signal with a different one of the first control signals for forming a first turn-on signal for each of the data-sets. It further includes at least one second operation circuit responsive to a second enabling signal and to a plurality of second control signals, wherein each of the second control signals corresponds to one of the data-sets, and wherein the enabling signal, control signal and data-sets commence at a different time within the clock timing cycle. The second operation circuit includes a control latching circuit for latching the second enabling signal and forming a latched enabling signal, and a transfer circuit. In one embodiment the transfer circuit is formed using a plurality of AND gates, wherein each of the AND gates ANDs the latched enabling signal and a different one of the second control signals for forming a second turn-on signal for each of the data-sets. It further includes a plurality of logic controllers. Each of the logic controllers is responsive to the first turn-on signal and to the second turn-on signal for a different one of the data-sets, and forming a set-enable signal for the different one of the data-sets. It further includes a plurality of set-enable latches. Each of the set enable latches receives and latches the set-enable signal for a different one of the data-sets and forming the select-data-set signal to feed the multiplexer circuit. It further includes a first delay circuit for receiving the outputs of the set enable latches and forming a first reset signal. The first reset signal is coupled to, and resets the control latching circuits thereby making the control latching circuits ready for a next clock timing cycle operation. It further includes a second delay circuit responsive to the selected-data-set, and forming a second reset signal. The second reset signal is coupled to and deactivates the logic controllers thereby making the logic controller ready for the next timing cycle operation. It further includes a third delay circuit responsive to the second reset signal for forming a third reset signal. The third reset signal is coupled to and resets the plurality of set-enable latches thereby completing the resetting of the signal selector circuit for the next clock timing cycle operation.

In one embodiment of the signal selector circuit, the first operation circuit provides a WRITE operation, and a second operation circuit is used for a system READ operation, and one other second operation circuit is used for a test READ operation. In one embodiment the signal selector circuit's test READ operation is an ABIST READ operation. In one embodiment the logic controller circuit is a dynamic NOR circuit. In one embodiment the signal selector circuit is for selecting the data-set from a pipelined set-associative cache CMOS circuit.

It is another aspect of the present invention to present a signal selection method comprising the steps of: providing a clock signal defining a clock timing cycle; providing a plurality of data-sets; receiving the data-sets; outputting a selected data-set in response to the activation of a select-data-set signal corresponding with the selected data-set; forming at least one first operation circuit responsive to a first enabling signal and to a plurality of first control signals, wherein each of the control signals corresponds to one of the data-sets, and wherein the enabling signal, control signal and data-sets commence at a different time within the clock timing cycle; ANDing the first enabling signal with a different one of the first control signals for forming a first turn-on signal for each of the data-sets; responding to at least one group of second operation signals, the second operation signals including a second enabling signal and a plurality of second control signals, wherein each of the second control signals corresponds to one of the data-sets, and wherein the enabling signal, control signal and data-sets commence at a different time within the clock timing cycle; latching the second enabling signal to form a latched enabling signal; forming a second turn-on signal for each of the data-sets by ANDing the latched enabling signal and a different one of the second control signals; forming a set-enable signal for the different one of the data-sets from the first turn-on signal and the second turn-on signal for a different one of the data-sets; receiving and latching the set-enable signal for the different one of the data-sets; receiving and delaying the set enable latches and forming a first delayed reset signal and the select-data-set signal corresponding with the selected data-set; resetting the control latching circuits with the first delayed reset signal, thereby making the control latching circuits ready for a next clock timing cycle operation; forming a second delayed reset signal from the selected-data-set signal; deactivating the plurality of logic controllers with the second delayed reset signal, thereby making the logic controllers ready for the next timing cycle operation; and forming a third delayed reset signal from the second delayed reset signal and resetting the plurality of set-enable latches with the third reset signal, thereby completing the resetting of the signal selector circuit for the next clock timing cycle operation.

In one embodiment the first operation is a WRITE operation in a wave-pipeline circuit implementation. In one embodiment the second operation is a system READ operation, and another second operation is an ABIST READ operation in a wave-pipeline circuit implementation.

BRIEF DESCRIPTION OF THE DRAWINGS

These and other objects, features, and advantages of the present invention will become apparent upon further consideration of the following detailed description of the invention when READ in conjunction with the drawing figures, in which.

DETAILED DESCRIPTION OF THE INVENTION

Figure 2A:
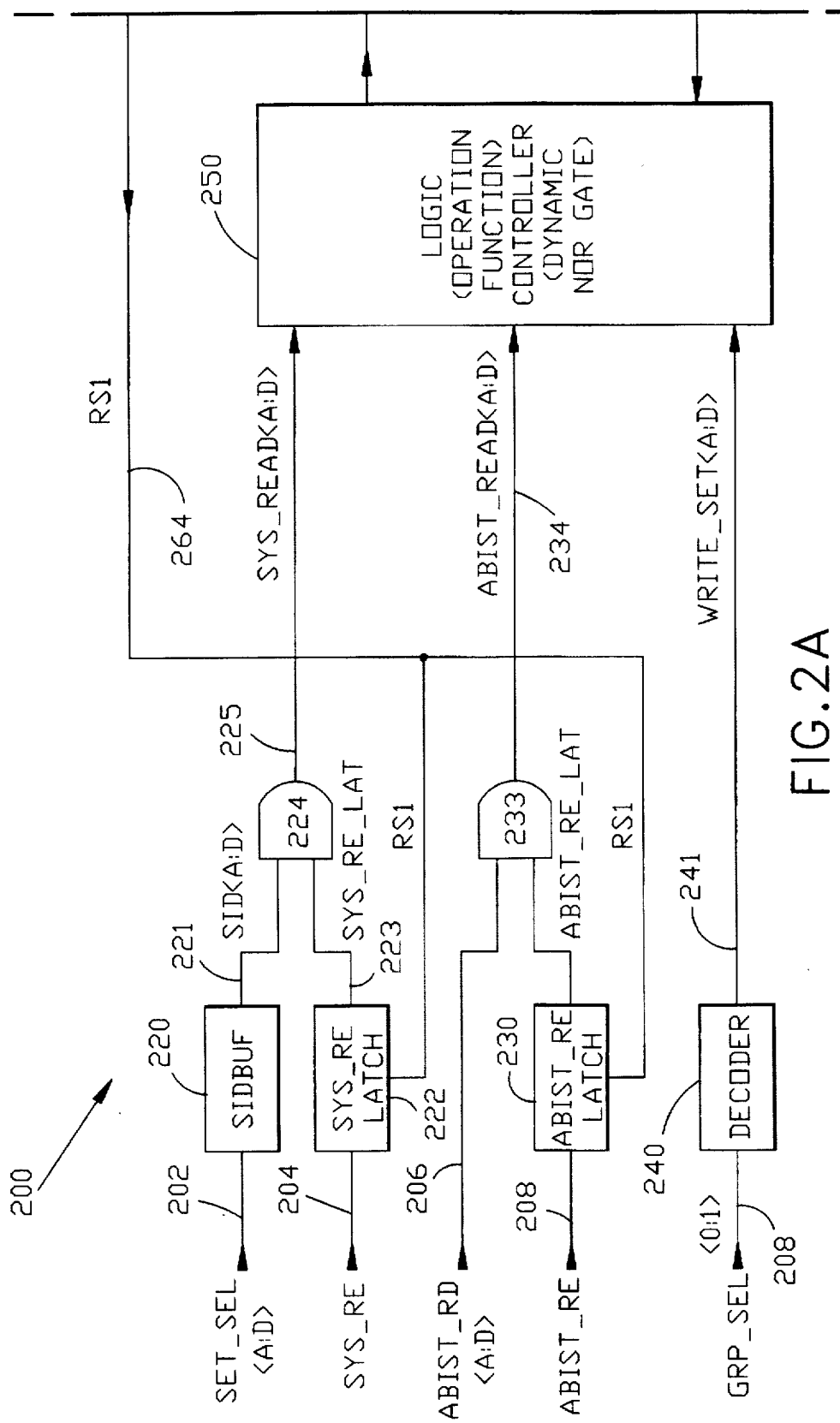
FIG. 2 shows a block diagram of a Set-Select Multiplexer in accordance with the present invention.

The present invention is a multiplexer circuit and method for a set-associative cache which supports pipelined READ/WRITE operations and array-built-in-self-test (ABIST). The circuit technique solves the disparity in the arrival time of pulse type input signals in 'READ' and 'WRITE' operations. It also provides capability to independently test the array macro. The pulse signal alignment requirement involves both the operation turn-on and the operation turn-off. At operation turn-on, since the input signals arrive at different times the circuit implementation must be such to produce proper overlap of pulses for logic function. At operation turn-off, the circuit needs to provide sufficient signal set-up and reset times to avoid signal collision between the signals of one clock cycle with those of the following clock cycle. The implementation of this invention satisfies this requirement by providing circuitry for the operation turn-on function separate from the operation enable and turn-off functions. It thereby can also implement a novel separate handshake reset scheme for operation turn-on and turn-off. The handshake reset scheme resets the turn-on circuit immediately after the operation turn-on signals are transferred to the operation enable circuitry. A similar handshake scheme is used for operation turn-off. An operation enable signal is maintained active until there is verification that the operation was indeed performed. Following this verification the operation enable signal is reset. In this way the turn-on signal is often readied for the next clock cycle even before the operation is implemented. This results in high speed reliable operation performance. Although the preset invention is described for associative cache READ and write operations the inventive concept is similarly appropriately applicable for other functions requiring reliable and/or high speed performance. A block diagram 200 of an embodiment of the set select multiplexer in accordance with the present invention is shown in FIG. 2. The purpose of the circuit is to be able to reliably perform either a READ or a WRITE operation, in either the system mode or built-in test mode, for a particular one of four data-sets A, B, C or D for clocked operation cycle. The circuit allows consecutive or alternating READ and WRITE operations. FIG. 2 shows the circuits for enabling a READ or WRITE operation for one of four data_sets 270 A,B,C or D. It has five input signal groups 202–210. Input signal set_sel<A:D> is buffered by buffer 220 forming sid<A:D> 221. Input signal sys_re 204 is latched by system-read-latch 222 to form sys_re_lat 223. Signals 221 and 223 are fed to a transfer circuit formed with AND gate 224 to form sys_read <A:D> 225. Input ABIST_re 208 is latched by ABIST-READ-latch 230 forming ABIST_re_lat 231. Signals 206 and 231 are fed to a transfer circuit formed by AND gate 233 forming ABIST_READ <A:D> 234. Two bit grp_sel<0-1> are decoded by WRITE decoder 240 to form WRITE_set<A:D> 241. Latches 222 and 230 are the turn-on latches for this embodiment. Signals 225, 234 and 241 are fed to logic-Controller 250 which forms operen<A:D> 251. Signal 251 is latched by set-latch 260 forming set<A:D> 261. Set-latch 260 also provides pulldown signal pd 262 which is fed into delay-1 263 to form the first handshake reset signal rs1 264. Signal 264 resets the turn-on latches 222 and 230 making both latches ready for the next clock cycle even before the operation in progress is completed. Set <A:D> 261 is fed to output-multiplexer 280 where it is ANDed with date_set <A:D> 271 to form data_out <A:D> 282. When data_out <A:D> 282 becomes active, output-multiplex 280 forms a operation done signal op_done 281. Signal 281 is fed to delay-2 283 and forms the second handshake signal rs2 284.

Reset rs2 284 forces logic controller 250 to its preset state and readies it for the next cycle's operation. The output rs2 284 of delay-2 283 is also fed to delay 3 285. The output of delay-3 285 is the third handshake reset signal rs3 286. Reset rs3 286 resets se6-latch 260. In this handshake reset method each latch is reset quickly only after it has received confirmation that its output was used to perform the function for which it is provided. At this point the operation of this clock cycle is completed and the circuit is ready for the next cycle's operation.

Figure 3B:
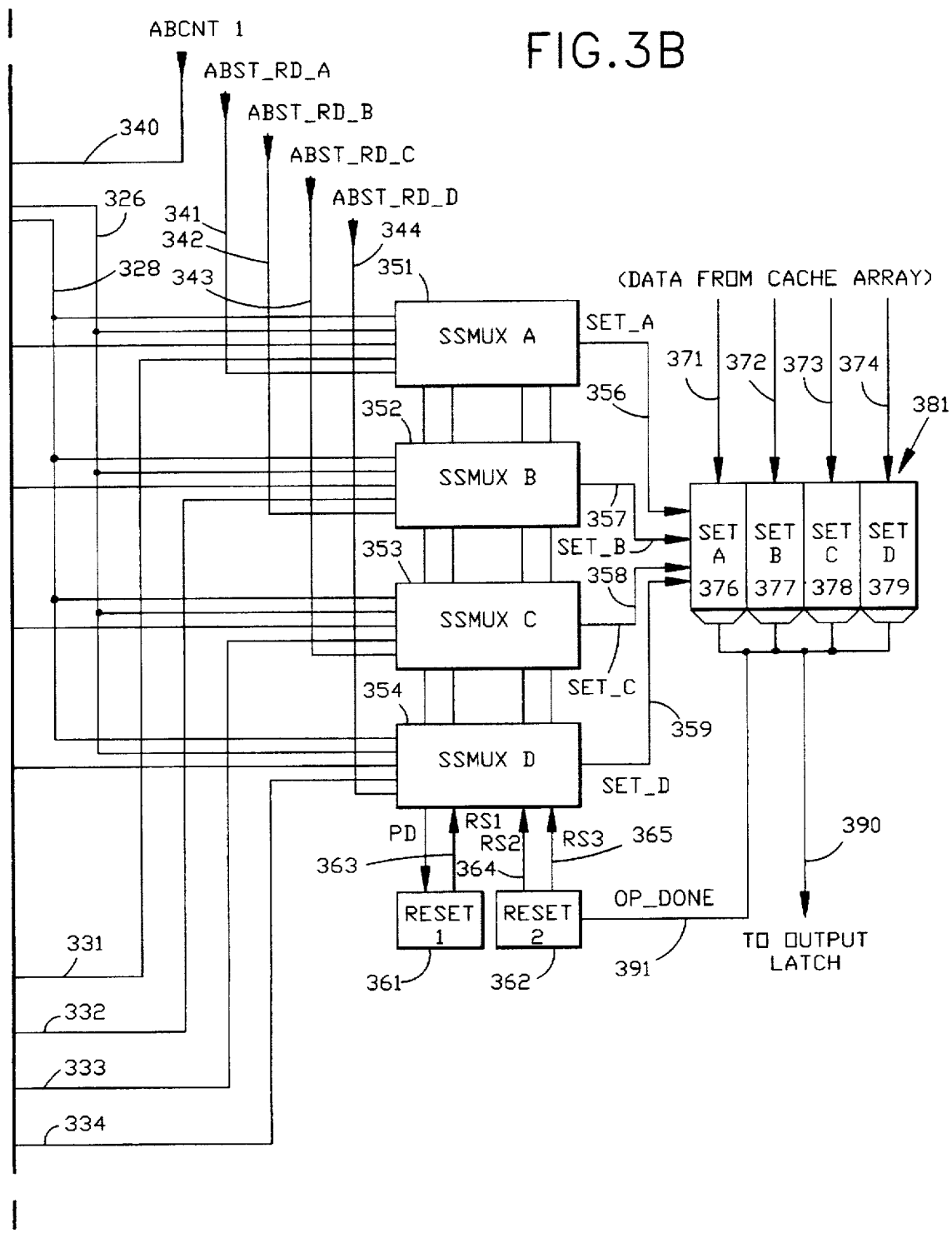
FIG. 3 shows a block diagram of a Read/Write Selection Logic circuit in accordance with the present invention.

FIG. 3 shows a high-level schematic of an embodiment of a READ/WRITE selection circuit 300 for a 4-way set-associative cache. The circuit and method is similarly appropriate to any multiple way cache. The selection circuit 300 is programmable to operate in both the system mode and the ABIST mode. When referring to a signal that has a separate line for each of the four data-sets A,B,C and D, it is referred to by the signal name followed by <A:D>.

Figure 1:
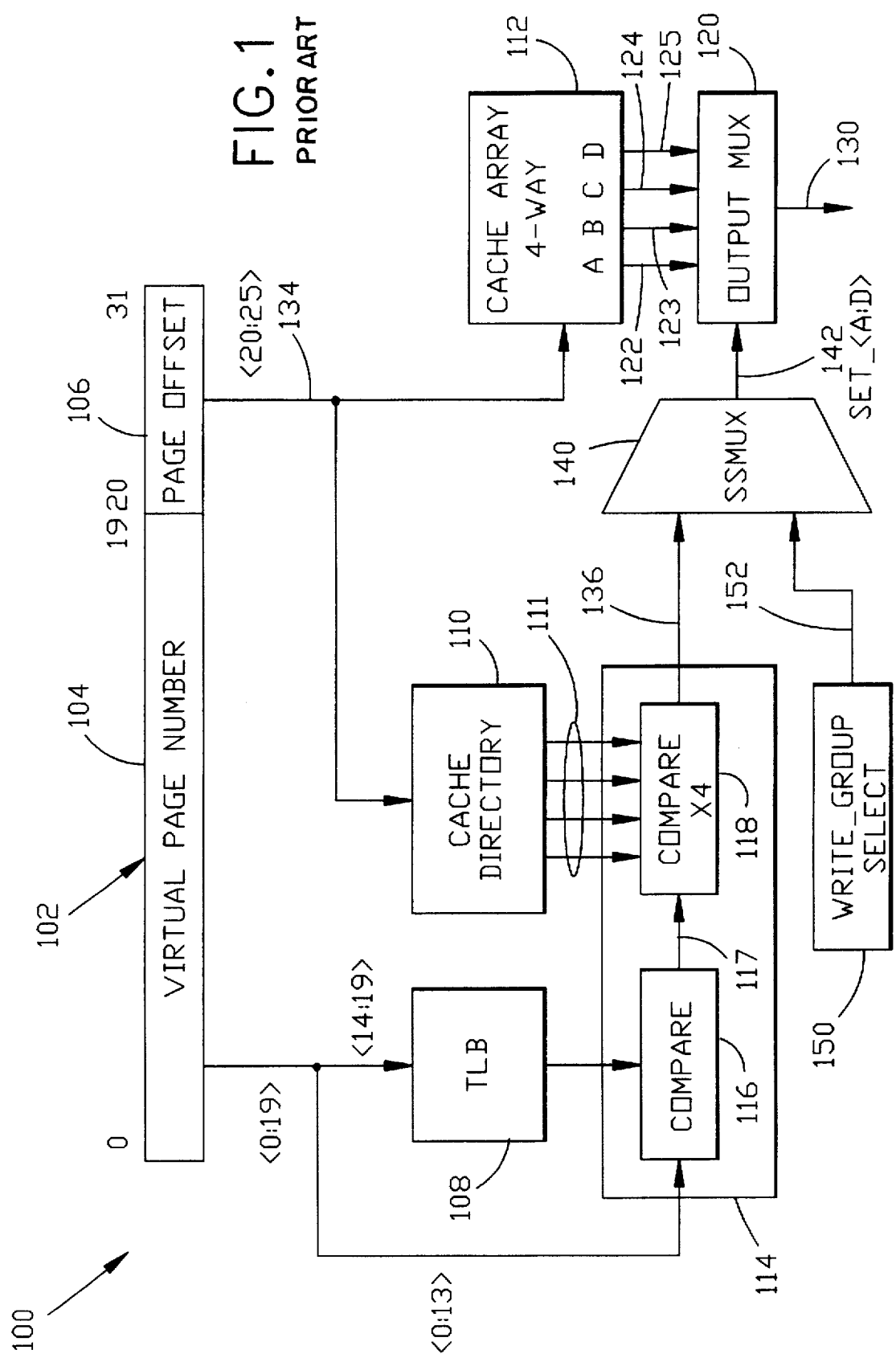
FIG. 1 shows a block diagram of a conventional four way set associative cache.

FIG. 3 shows a READ/WRITE LATCH 302, a group_select_bit_0_latch 304 and a group_select_bit_1_latch 306. Four set-select buffers 308–311 provide the required high current drive conversion of the four set-selection lines, set_sel<A:D> 136 delivered from the hit logic circuit of FIG. 1. Each set select buffer 308–311 is formed from a single stage driver which replaces the circuit of FIG. 2, to provide sid<A:D>. The output 'wt' 314 from the READ/WRITE latch 302 is buffered in Read-write buffer 'wtbuf' 316. This buffer gates the group-select decoders, 'gsand'<A:D>, 317–320, which perform a 1-of-4 decoding using address group_select_bit_0 323 and group_select_bit_1 324. In the WRITE mode, one of the four 'gs_<A:D>' 336–339 lines goes high and activates the corresponding 'SSMUX' from among 'SSMUX<A:D>' 351–354. Output 'wc' 313 from the READ/WRITE control latch 302 is buffered by the 'wcbuf' circuit 312 and outputs the READ_enable signal 326. The read-enable signal 326 drives the 'SSMUX' circuit 351–354 to control the READ operation. In the system mode, set selection is provided by the hit logic through 'set_sel'<A:D> 136. In the ABIST mode four corresponding signals, 'abst_rd'<A:D> 341–344, are supplied by the ABIST engine (not shown). The 'wcbuf' circuit 312 is fed an ABIST control signal 'abcntl' 340 to toggle between the system mode when 'abcntl' is high and the ABIST mode when 'abcntl' is low. The output read-enable 326 is high and the output 'abre' 328 is low in the system mode, and vice versa in the ABIST mode. Functionally, the 'SSMUX' 351–354 circuits multiplex the control paths for system-WRITE, gs_<A:D> 336–339, system-READ sid<A:D> 331–334, and ABIST-READ, 341–344. The 'SSMUX' circuits. 'SSMUX'_A through 'SSMUX'_D. generate four gating signals. set_A through set_D. to control the cache data mux. The resulting selection 'set'<A:D>356-359 enables the output mux 381 of the cache array data-set<A:D> 376-379. At any time, only one of the four lines can be high for a valid selection.

Figure 4:
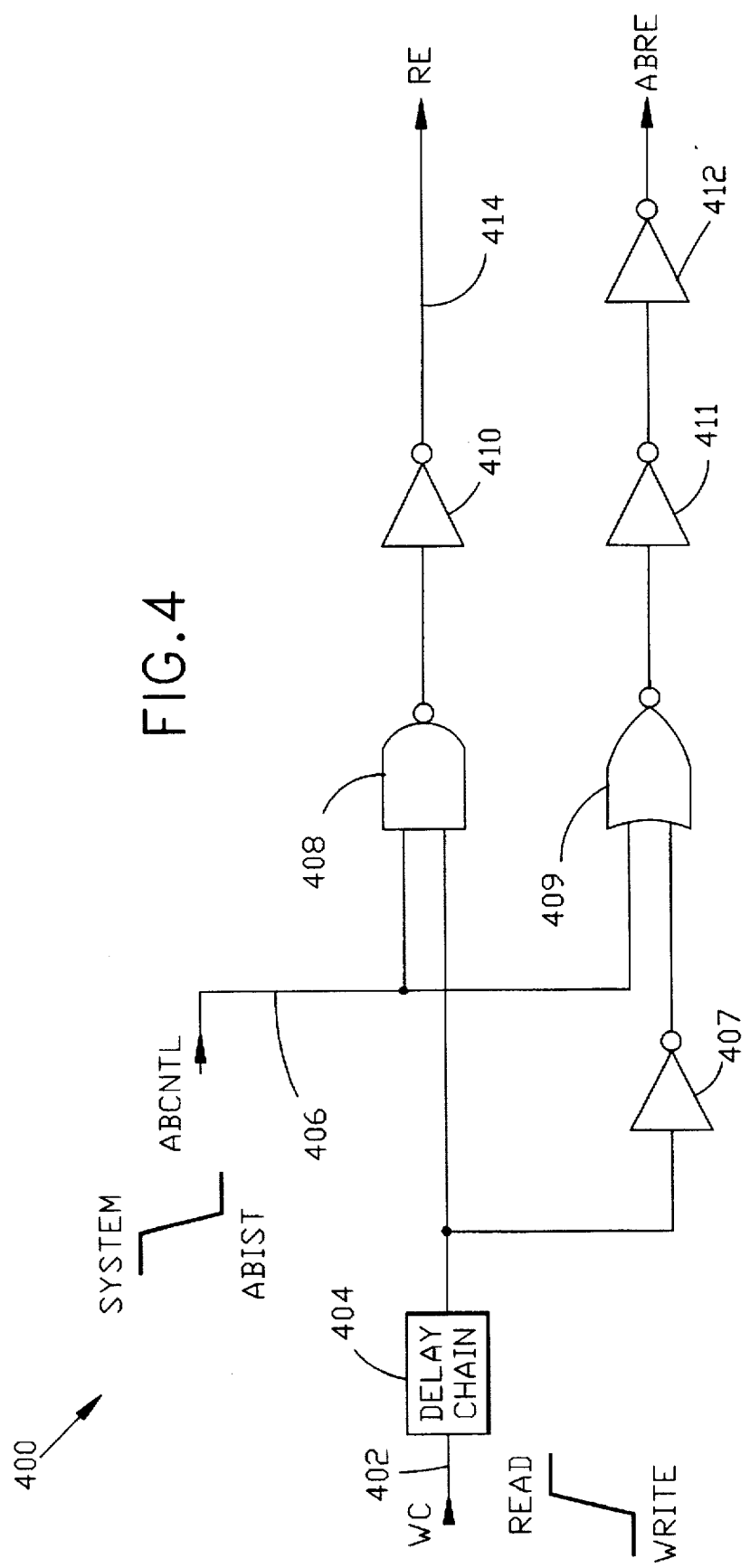
FIG. 4 shows a schematic diagram of a READ Selector in accordance with the present invention.

FIG. 4 shows the READ select circuit 400. It generates a pulse for 'sysre' 414 or 'absre' 416 depending upon the ABIST control 'abcntl' 406 signal. Both the systems READ enable 'sysre' 414 and the ABIST READ enable 'abre' 416 are generated with circuit elements 407–412 in a circuit not in the critical path. In the system mode, 'abcntl' 406 is set high, forcing 'abre' 416 to a low. In the ABIST testing mode, 'abcntl' 406 is set to low, forcing 'sysre' 414 to be low. The outputs 'sysre' 414 and 'absre' 416 are delayed versions of the input 'READ' pulse 'wc' 402. This delay provided by delay chain 404 is necessary to delay the outputs 414, 416 which would otherwise become active too early in the cycle. This is particularly important in successive READ cycles. The delay is set so that 'sysre' 414 and 'absre' 416 do not overlap with the sid <A:D> 331-334 pulses from the previous cycle.

Figure 5:
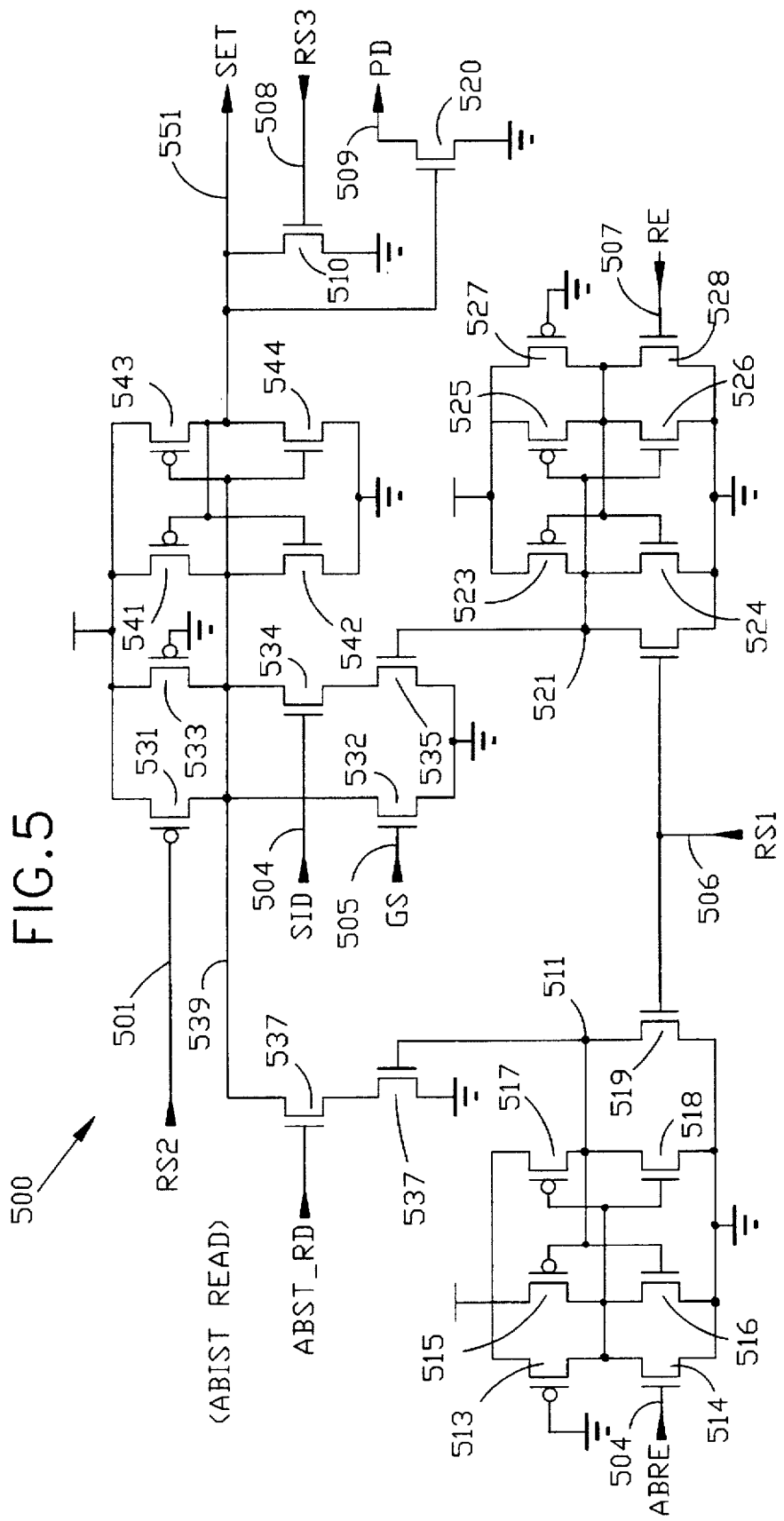
FIG. 5 shows a schematic diagram of a set select multiplex in accordance with the present invention.

An embodiment of an 'SSMUX' circuit 500 in accordance with the present invention is shown in FIG. 5. FIG. 5 shows one of 'N' 'SSMUX' circuits for a N-way cache. A set-mux select circuit 500 is provided for each data-set that may be selected by the address of the cache READ or WRITE operation. In the case discussed presently there is a 'SSMUX' circuit 500 provided for data-set A (122 in FIG. 1), data-set B, (124) data-set C (126) and data-set D (128). Only one set identification signal (see FIG. 3) sidA 331, sidB 332, sidC 333 or sidD 334 is active at any time in correspondence with a hit logic 'hit'. The 'SSMUX' circuit includes a dynamic NOR circuit with three logic paths for system WRITE, system-READ and abist READ. These include transistor 532 for system-WRITE, transistors 534, 535 for system-READ, and transistors 536, 537 for ABIST-READ. The NOR circuit 530 output is at node 539. At standby, node 539 is preset to a high by transistor 531, forces output node 'set' 551 to be low. Transistor 533 serves as a bleeder for the initialization NOR circuit 530. The activated sid<A:D> signal 504 enables its corresponding NOR circuit 530. The particular enabled NOR circuit 530 has its output 539 pulled low when one of three input signals becomes activated. The three signals are 'abstrd' 502 for an ABIST READ, 'sysre' 507 for a system READ and write 505 for a WRITE operation. When one of the three logic paths become activated the mux is selected pulling node 539 down to a 'low'. This generates a 'high' signal at output node 'set'<A:D> 551. Set latch comprising transistors 541-544, latches node 539 in its low state until it is reset by set-latch reset 'rs3'. The 'set' 551 signal enables the output mux (FIG. 3, 381) to form output signal 'op-done' 391, and dataset<A:D> 390 of FIG. 3. This completes the cache memory READ or WRITE operation for this cycle. The rise of 'set'A:D> 551 also generates a pulldown signal 'pd' 509, used in forming reset 1, 'rs1' 506. Reset 'rs1' 506 resets nodes 511 and 521 to a low, cutting off the activated NOR circuit enabling path. This causes the 'SSMUX' circuit to become cleared of the previous cycles 'sid' <A:D> 504 signal driven from the hit logic, and to become ready for the next clock cycle.

READ Enable Latch comprises transistors 523-528. It captures and holds the system READ signal 'sysre' 507 pulse. This is required because the 'sid' 504 pulse arrives very late in the cycle after 'sysre' 507 may have already been reset to low. This latch guarantees proper pulse alignment between node 'sid' 504 and system READ latch output node 521 when in the system READ mode.

In the ABIST mode an ABIST READ latch is used. It is comprised of transistors 513-519. In this mode, node 'abre' 503 goes high and node 'sysre' 507 goes low. This causes node 511 to switch from low to high and activate transistor 537. The ABIST READ signal 'abst_rd' 502 is supplied by the ABIST engine (not shown) as a DC signal. Compared to the conventional ABIST port implementation in FIG. 2, the 'SSMUX' circuit 500 removes much of the series gating from the critical path by using a simple inverting buffer for each sidbuf<A:D> 308-311 to provide current drive. The added ABIST load of transistor 536 is designed to have minimal loading effect on node 539.

In the WRITE mode, both the system READ 'sysre' 507 and the ABIST READ 'abre' 503 are low and the 'WRITE' 505 signal is decoded from the group address bits grp_sel_0 323 and grp_sel_1 324 of FIG. 3. Note that the 'WRITE' 505 arrives early in the cycle while 'sid' 504 in the read mode arrives late in the cycle. In a write-after-read case the 'sid' 504 signals from the previous cycle might not yet be reset. Node 521 is forced low by 'rs1' 506 to insure that node 539 is preset to a high so that a false WRITE will not occur when 'WRITE' 505 is low.

Another important feature of this embodiment is the manner that the 'SSMUX' 500 latches are reset. The 'SSMUX'-latches are special handshake type latches. Each handshake latch becomes reset only after confirmation that its output is used. All the possible data-sets A-D feed the output mux 381 with their corresponding latched 'sense-amp' <A:D> signals 371-374. The output mux 381 performs a logical AND function of the set <A:D> 356-359 signal and the sense_amp <A:D> 371-374 signals. Is makes data output signal 'op-done' 391 active only when both input signals are active simultaneously. When the 'done' 391 signal is active it produces two reset signals as shown in FIG. 6.

Figure 6:
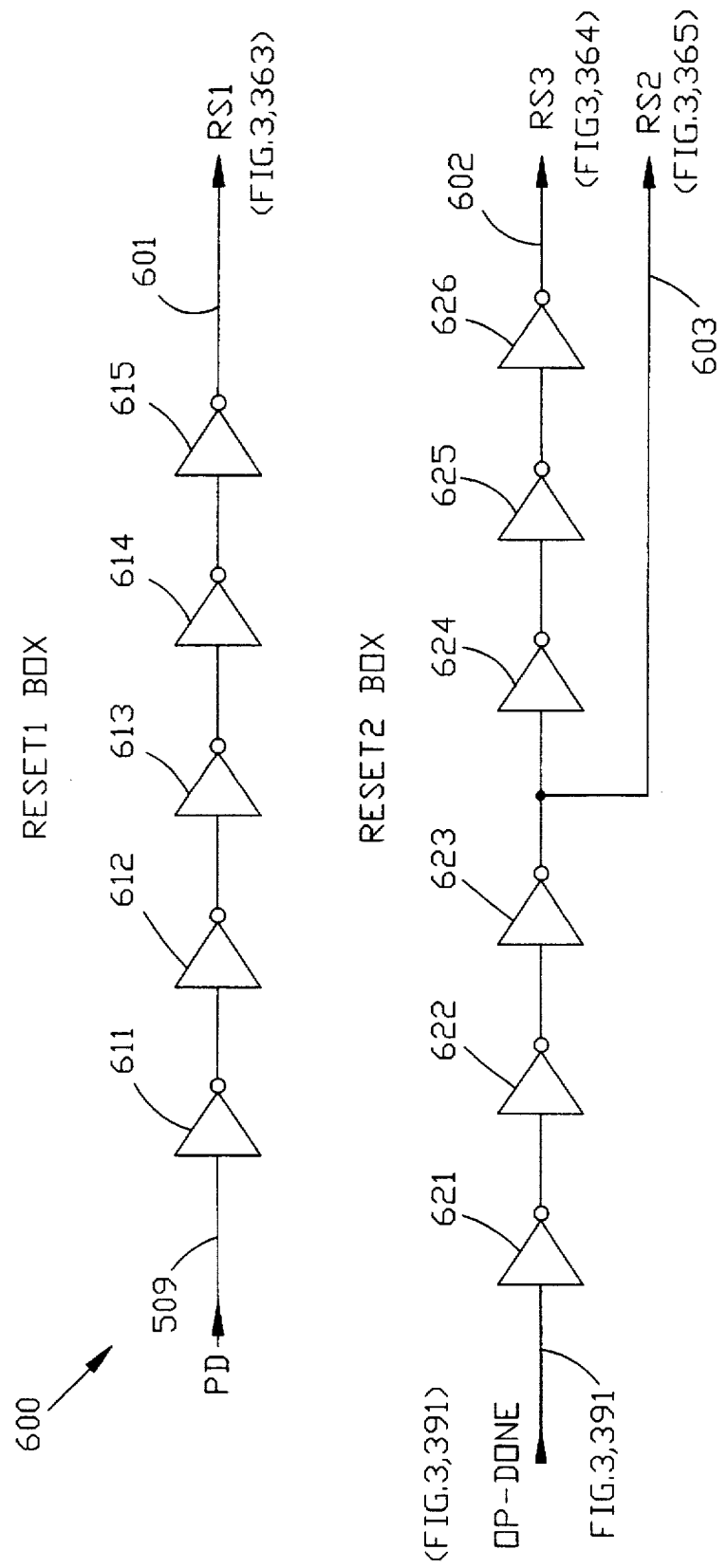
FIG. 6 shows a reset circuit in accordance with the present invention.

FIG. 6 shows a schematic of an embodiment of the reset circuit 600. Reset signal 'rs1' 601 is generated from pull-down signal pd 509 after the propagation delay of components 611-615. Reset signal 'rs2' 602 is generated form 'op-done' 391 after the propagation delay of components 621-623. Reset signal 'rs3' 603 is generated after an additional delay of components 624-626. Thus the 'SSMUX' latches are reset by reset signals 'rs2' 602 and 'rs3' 603 generated from a delay chain derived from the cache output mux 381 output signal 'done' 391. This 'handshaking' scheme ensures that node 539 does not get reset before the desired data-set (390 of FIG. 3) is ready. In many cases, this is crucial because the set-select signal may otherwise be held high across the clock cycle boundary causing node 'sid' 504 to switch back to an inactive state late into the next cycle. This novel two-step reset scheme of the present invention of separating the preset and reset of the latches of the operation-start from the latches of the operation-complete improves the cycling capability and access speed of the cache array by making it quasi independent of the reset of the hit logic (136 of FIG. 1)

This implementation also permits a mode control bit to select whether it should take input from the hit logic or from the ABIST engine thereby providing full ABIST capability without introducing extra delay in developing the desired 'set'<A:D> 356-359 signal. This is in contrast to the conventional way of implementing ABIST capability by adding a mux port to the input of 'sidbuf'<A:D> 308-311.

Figure 7:
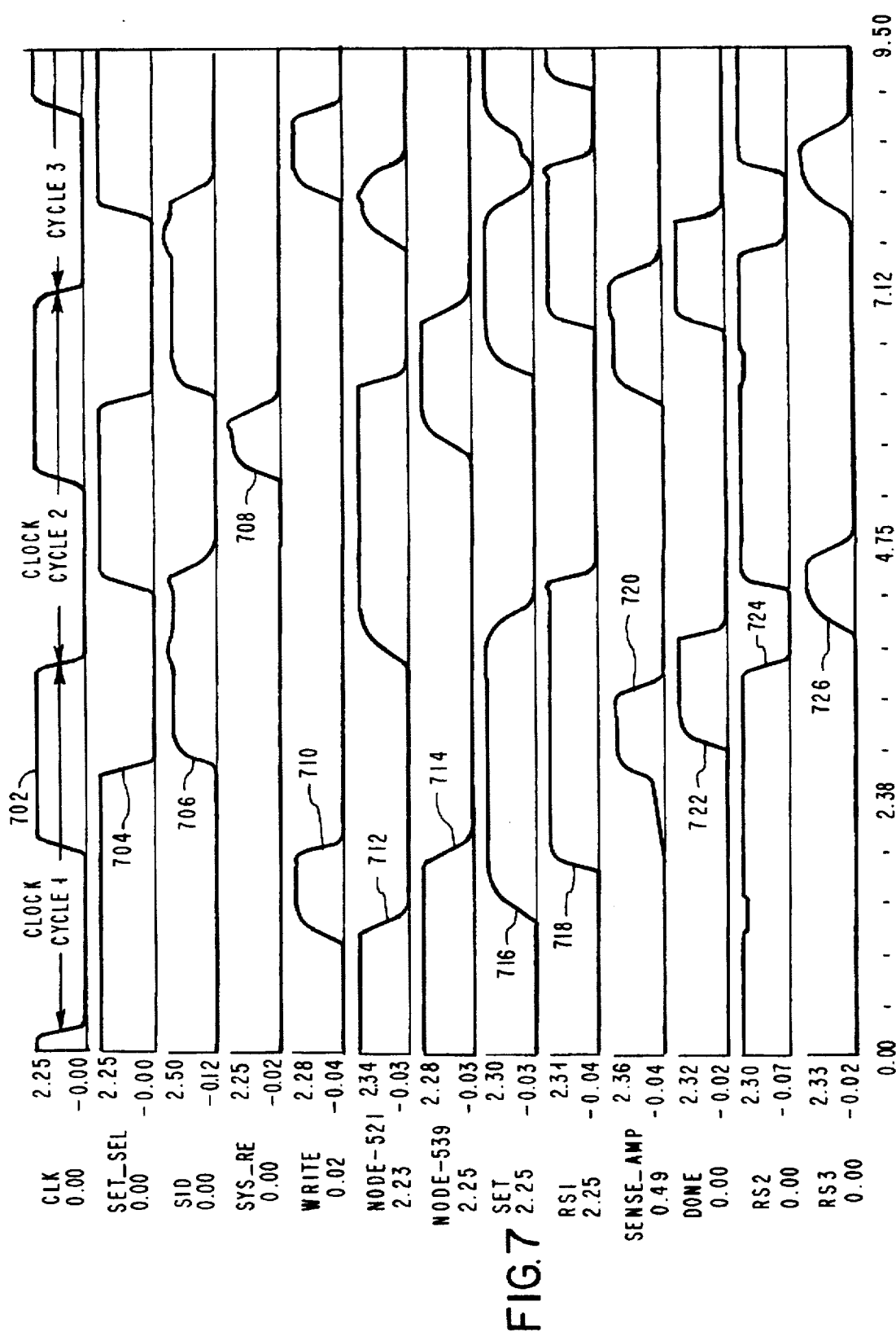
FIG. 7 shows simulated waveforms of an embodiment in accordance with the present invention.

FIG. 7 illustrates simulated waveforms of a successfully operated cache SRAM in accordance with the present invention. The simulation circuit uses IBM's quarter micron CMOS technology. In this embodiment 'clk' 702 is the low-active system clock with a cycle time of 3.5 nsec. The first cycle simulates a WRITE operation. The second cycle simulates a READ operation. Waveform 704 shows the set_sel signal <A:D> 136 coming from the hit logic 114 is also a low-active signal. It arrives at the cache about 2.7 nsec into the cycle. It gets buffered by 'sidbuf' 308–311 and is converted into a high-active signal 'sid' 331–334 waveform 706. During this cycle of cache WRITE, the 'write' signal, waveform 710, is delayed by only two stages of logic delays from a latch 302, 304, or 306 and a decoder 317–320. In this cycle the 'SSMUX' 500 output node 'set' 551, waveform 716, arises relatively early in the cycle. The rising edge of node 'set' 551, waveform 716, triggers 'rs1' 506, waveform 718, while it is held by the set latch. The output mux 381 waits for the array data sense_amp 371–374, waveform 720, to become high. Sense_amp 371–374 arrives at about 2.4 nsec into the cycle. This causes one of the four data-sets A, B, C or D is to be selected as signal 390 and is transferred to the output latch (not shown). The 'set' 551 signal also triggers the reset of node 539 shown as waveform 714. The node 'set' 551 is reset back to a low near the cycle boundary after the data transfer has been completed.

It is noted that although the set_sel 136 signal is switching, the sys_re signal is not active in this WRITE cycle. Nevertheless, the sid 331–334 signal must be reset since it spills over into the next cycle of cache READ. The resetting of node 'sid' is rippled from the hit logic, which is itself reset by the derivatives of the system clock. The reset delay includes the preset time of the hit logic, interconnect RC delays, and the 'sidbuf' 308–311 circuit. In the case shown it adds up to 1.1 ns relative to 'clk'. Node 521 is not allowed to become active before 'sid' 331–334 is completely reset, otherwise false selection may occur. The sys_re signal shown as waveform 708 is indeed properly displaced from the 'sid' pulse waveform 706 of the previous cycle. The capture latch insures that node 521 will intersect properly with the valid 'sid' data. The rising of node 'set' 551 occurs late in the cycle, gated by the arrival of 'sid' 331–334. In this case, the array data are latched in the sense amplifiers, waiting for a 'set' signal to complete the final selection. The resetting of node '539' is similar to the WRITE case.

Figure 8:
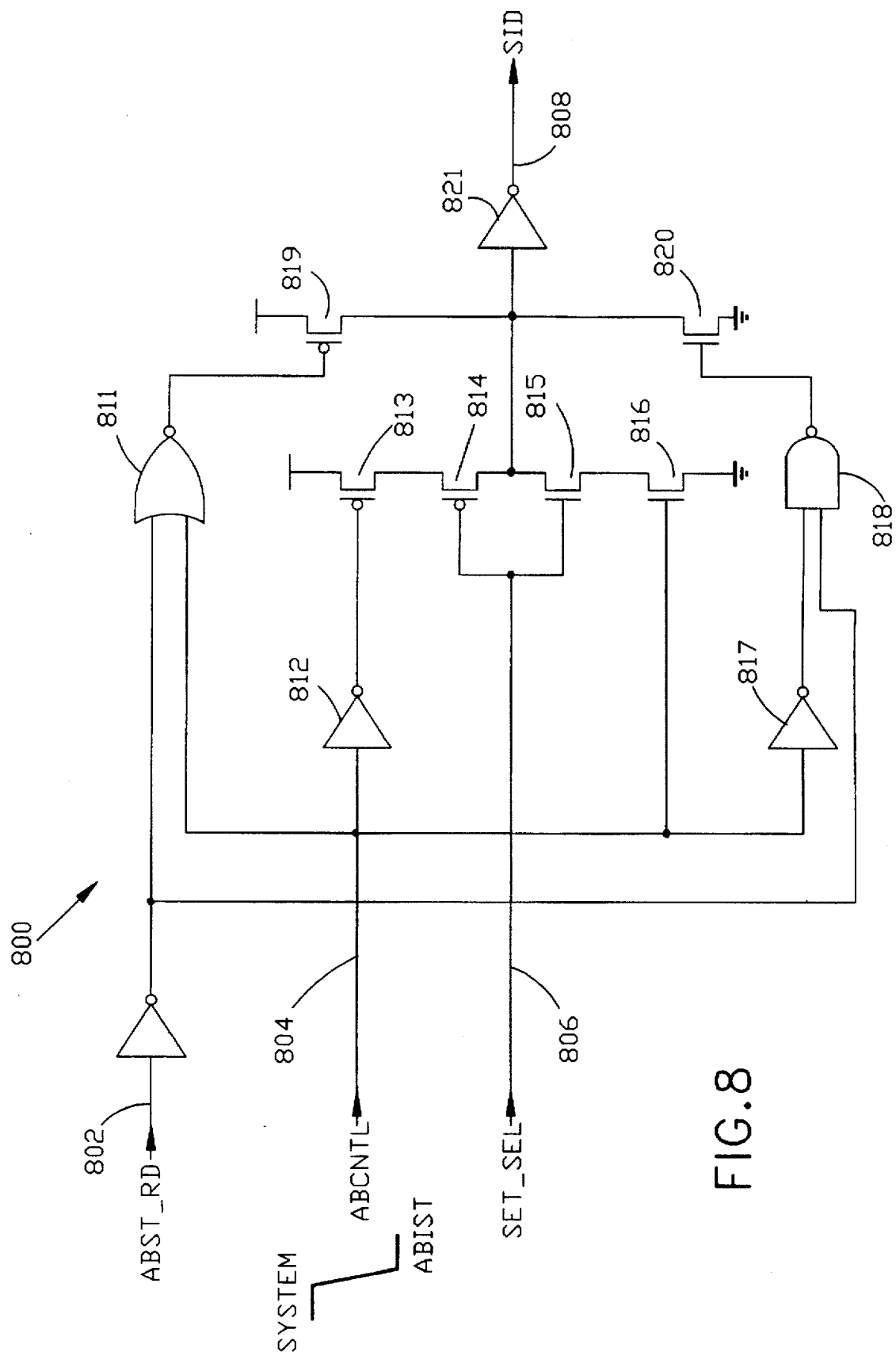
FIG. 8 shows a conventional set_select receiver.

It now becomes apparent that the described inventive technique overcomes several problems that would result if a conventional set select circuit would be used. An example of the heretofore conventional method is shown in FIG. 8. FIG. 8 shows such a conventional set-select receiver circuit 800. It provides for introducing and selecting both the system READ and the ABIST READ operation. It also provides a high current drive capability. Three signals abst-rd 802, abcntl 804 and set-sel 806 feed receiver circuit 800 to form a set identification signal sid<A:D> 808 using components 810–821.

This type of implementation causes an increased stack height of the receiver circuit which imposes a further delay penalty upon an already long gating path. It also has the disadvantage of adding stack height to the buffer stage in the critical path because of the series gating devices 811–818 added for ABIST control. This produces a performance slow down of the system because of resulting delay in the critical path. It also requires a large transistor size for transistor 813 and transistor 816 in order to minimize the body effect on transistors 814 and 815. In the alternative, all device sizes need to be increased in order to achieve the same performance. This results in an undesirable layout area overhead and an increase in the input loading capacitance to the hit logic. In accordance with the present invention, a much more desirable buffer implementation for generating sid<A:D> from set_select <A:D> is the simple inverter driver for each sidbuf circuit 308–311 as shown in FIG. 3. ABIST mode is implemented as described above without the unnecessary delay in the critical path Thus, the improved 'SSMUX' circuit of this invention allows ABIST provision with minimal impact on the critical path delay.

Although the description is made for a particular arrangement, the intent and concept of the present invention are suitable and applicable to other technologies, and circuit arrangements. It will be clear to those skilled in the art that other modifications to the disclosed embodiments can be effected without departing from the spirit and scope of the invention.

What is claimed is:

1. A signal selector circuit driven by a clock signal defining a clock timing cycle comprising:

a multiplexer for receiving a plurality of data-sets and having means for outputting a selected data-set in response to the activation of a select-data-set signal corresponding with said selected data-set;

a set select multiplexer to supply said selected data-set comprising:

at least one first operation circuit responsive to a first enabling signal and to a plurality of first control signals each corresponding to one of said data-sets, and wherein said enabling signal, first control signals and data-sets commence at a different time within said clock timing cycle, said first operation circuit including a means for transferring said first control signals to a first turn-on signal for said one of said data-sets in response to said first enabling signal;

at least one second operation circuit responsive to a second enabling signal and to a plurality of second control signals each corresponding to one of said data-sets, and wherein said second enabling signal, second control signals and data-sets commence at a different time within said clock timing cycle, said second operation circuit including a control latching circuit to latch said second enabling signal and form a latched enabling signal, and a means for transferring said second control signals to a second turn-on signal for each of said data-sets in response to said latched enabling signal;

a plurality of logic controllers for each said different one of said data-sets coupled to, and activated by, said first and second turn-on signals, and including means for forming a set-enable signal for each said different one of said data-sets; and a plurality of set-enable latches having means for receiving and latching each said set-enable signal for said different one of said data-sets, and having means for forming said select-data-set signal to feed said multiplexer;

a first delay circuit coupled to receive said select-data-set signal and having means for forming a first reset signal, said first reset signal being coupled to reset said control latching circuit thereby making said control latching circuit ready for a next clock timing cycle operation;

a second delay circuit coupled to receive said selected-data-set, and having means for forming a second reset signal, said second reset signal being coupled to deactivate said plurality of logic controllers thereby making said logic controller ready for said next clock timing cycle operation; and a third delay circuit coupled to receive said second reset signal having means for forming a third reset signal, said third reset signal being coupled to reset said plurality of set-enable latches making said set-enable latches ready for said next clock timing cycle operation.

2. A signal selector circuit as in claim 1 in which said first operation circuit is in response to a WRITE operation, and in which one said second operation circuit is in response to a system READ operation and one other said second operation circuit is in response to a test READ operation.

3. A signal selector circuit as in claim 2 in which said test READ operation is an ABIST READ operation.

4. A signal selector as in claim 1 in which said logic controller circuit is a dynamic NOR circuit.

5. A signal selector circuit as in claim 1 in which said signal controller is comprised of CMOS components.

6. A signal selector circuit as in claim 1 for selecting said data-set from a pipelined set-associative cache CMOS circuit.

7. A signal selection method for a system driven by a clock signal defining a clock timing cycle and receiving a plurality of data-sets, said method comprising the steps of:

forming at least one first operation circuit responsive to a first enabling signal and to a plurality of first control signals each corresponding to one of said data-sets, and wherein said enabling signal, control signals and data-sets commence at a different time within said clock timing cycle;

transferring said first control signals in response to said first enabling signal to form a first turn-on signal for each of said data-sets; sets;

responding to at least one group of second operation signals, said second operation signals including a second enabling signal and a plurality of second control signals, wherein each of said second control signals corresponds to one of said data-sets, and wherein said enabling signal, control signal and data-sets commence at a different time within said clock timing cycle;

latching said second enabling signal to form a latched enabling signal;

forming a second turn-on signal for each of said data-sets by transferring a different one of said second control signals in response to said latched enabling signal;

activating a set-enable signal for said different one of said data-sets from said first and second turn-on signals for a different one of said data-sets;

latching said set-enable signal to form a latched set signal;

delaying said latched set signal to form both a first delayed reset signal and a select-data-set signal for a selected data-set;

outputing said selected data-set in response to said select-data-set signal;

resetting said latched enabling signal with said first delayed reset signal, thereby making said system ready for a next enabling signal for a next clock timing cycle operation;

forming a second delayed reset signal from said selected-data-set signal;

deactivating said set-enable signal with said second delayed reset signal, thereby making said system ready for a next activation of said set-enable signal for said next timing cycle operation;

forming a third delayed reset signal from said second delayed reset signal; and resetting said latched set signal with said third delayed reset signal, thereby making said system ready for latching a next set signal for said next clock timing cycle operation.

8. A method as in claim 7 wherein said first operation is a WRITE operation in a wave-pipeline circuit implementation.

9. A method as in claim 7 wherein one said second operation is a system READ operation, and another said second operation is an ABIST READ operation.

10. A method for selecting an output data-set from a plurality of input data-sets, comprising the steps of:

accepting a clock timing signal defining a clock timing cycle;

latching an operation enabling signal for a first timing cycle to form a latched enabling signal, said enabling signal having a duration that may terminate prior to an activation of a plurality of control signals, said control signals commencing at a different time from a time of commencement of said data-sets and said enabling signal, each of said control signals corresponding to one of said data-sets;

transferring said control signals upon receiving said latched enabling signal to form a plurality of transfer signals;

coupling each of said transfer signals to activate a logic controller corresponding to said one of said data-sets to form a set-data-set signal;

latching said set-data-set signal to form a latched select-data-set signal and a first reset signal;

resetting said latched enabling signal with said first reset signal to become ready to latch a next operation enabling signal for a next clock timing cycle;

transferring one of said input data-sets in response to said latched data-set signal to form said output data-set and a second reset signal;

deactivating said logic controller with said second reset signal to become ready to activate said logic controller for said next clock timing cycle;

delaying said second reset signal to form a third reset signal;

resetting said latched data-set signal with said third reset signal to become ready to select a next output data-set for said next clock timing cycle.

11. A method as in claim 10 wherein said operation enabling signal is in response to a READ operation in a wave-pipeline circuit implementation.

12. A method as in claim 10 wherein said operation enabling signal is in response to an ABIST READ operation in a pipelined set-associative cache circuit.

13. A method as in claim 10 employing CMOS components.

* * * * *